United States Patent
Lee et al.

(10) Patent No.: US 9,324,500 B2
(45) Date of Patent: Apr. 26, 2016

(54) MULTILAYER CERAMIC ELECTRONIC COMPONENT TO BE EMBEDDED IN BOARD AND PRINTED CIRCUIT BOARD HAVING MULTILAYER CERAMIC ELECTRONIC COMPONENT EMBEDDED THEREIN

(71) Applicant: SAMSUNG ELECTRO-MECHANICS CO., LTD., Suwon, Gyunggi-do (KR)

(72) Inventors: Hai Joon Lee, Gyunggi-do (KR); Jin Man Jung, Gyunggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 285 days.

(21) Appl. No.: 14/171,306

(22) Filed: Feb. 3, 2014

(65) Prior Publication Data

US 2015/0122535 A1    May 7, 2015

(30) Foreign Application Priority Data

Nov. 4, 2013 (KR) .................. 10-2013-0132847

(51) Int. Cl.
H01G 4/30    (2006.01)
H01G 4/224   (2006.01)
H01G 4/232   (2006.01)
H05K 1/18    (2006.01)

(52) U.S. Cl.
CPC .............. H01G 4/30 (2013.01); H01G 4/224 (2013.01); H01G 4/232 (2013.01); H01G 4/2325 (2013.01); H05K 1/185 (2013.01); H05K 2201/10015 (2013.01)

(58) Field of Classification Search
CPC ............................. H01G 4/12–4/129
See application file for complete search history.

(56) References Cited

U.S. PATENT DOCUMENTS

| 5,561,828 A * | 10/1996 | Igaki ........................ H01G 4/30 419/10 |
| 2002/0041006 A1* | 4/2002 | Ahiko ..................... H01G 4/232 257/532 |
| 2005/0248908 A1* | 11/2005 | Dreezen ............... H01G 4/2325 361/306.3 |
| 2006/0221550 A1* | 10/2006 | Ryu ....................... B82Y 30/00 361/321.5 |
| 2007/0086174 A1* | 4/2007 | Minamio ............... H05K 3/284 361/761 |

(Continued)

FOREIGN PATENT DOCUMENTS

| JP | 2009-021512 A | 1/2009 |
| JP | 05-144666 B2 | 2/2013 |
| KR | 10-2006-0047733 | 1/2009 |

*Primary Examiner* — Jeremy C Norris
*Assistant Examiner* — Muhammed Azam
(74) *Attorney, Agent, or Firm* — McDermott Will & Emery LLP

(57) ABSTRACT

There is provided a multilayer ceramic electronic component to be embedded in a board including: a ceramic body including dielectric layers and having first and second main surfaces opposing one another, first and second lateral surfaces opposing one another, and first and second end surfaces opposing one another; first and second internal electrodes stacked to be spaced apart from both end surfaces of the ceramic body at a predetermined distance with the dielectric layers interposed therebetween, respectively; and first and second external electrodes formed in both end portions of the ceramic body, wherein the first and second external electrodes include first and second base electrodes and first and second terminal electrodes formed on the first and second base electrodes, respectively, and a non-conductive paste layer is formed on both lateral surfaces of the ceramic body.

29 Claims, 13 Drawing Sheets

(56) References Cited

U.S. PATENT DOCUMENTS

| | | | |
|---|---|---|---|
| 2007/0119617 A1* | 5/2007 | Hayashi | H01L 21/4857 174/260 |
| 2010/0071944 A1* | 3/2010 | Endo | H01L 21/4853 174/260 |
| 2010/0097739 A1* | 4/2010 | Prymak | H01G 4/12 361/301.4 |
| 2011/0255209 A1* | 10/2011 | Ishida | H01G 4/232 361/306.1 |
| 2011/0293894 A1* | 12/2011 | Sato | H01G 4/005 428/189 |
| 2012/0018205 A1* | 1/2012 | Sato | H01C 1/14 174/260 |
| 2012/0019981 A1* | 1/2012 | Yoshida | H01C 1/1406 361/321.1 |

* cited by examiner

MULTILAYER CERAMIC ELECTRONIC COMPONENT TO BE EMBEDDED IN BOARD AND PRINTED CIRCUIT BOARD HAVING MULTILAYER CERAMIC ELECTRONIC COMPONENT EMBEDDED THEREIN

CROSS-REFERENCE TO RELATED APPLICATION

This application claims the benefit of Korean Patent Application No. 10-2013-0132847 filed on Nov. 4, 2013, with the Korean Intellectual Property Office, the disclosure of which is incorporated herein by reference.

BACKGROUND

The present disclosure relates to a multilayer ceramic electronic component to be embedded in a board and a printed circuit board having a multilayer ceramic electronic component embedded therein.

As electronic circuits have become highly densified and highly integrated, a mounting space for passive elements mounted on a printed circuit board (PCB) has become insufficient. In order to solve this problem, ongoing efforts have been made to implement components able to be installed within a board, such as embedded devices. In particular, various methods have been proposed for installing a multilayer ceramic electronic component used as a capacitive component within a board.

As one of a variety of methods of installing a multilayer ceramic electronic component within a board, the same dielectric material used for a multilayer ceramic electronic component is used as a material for a board and a copper wiring, or the like, is used as an electrode. Other methods for implementing an embedded multilayer ceramic electronic component include forming an embedded multilayer ceramic electronic component by forming a polymer sheet having high-k dielectrics or a dielectric thin film within a board, installing a multilayer ceramic electronic component within a board, and the like.

In general, a multilayer ceramic electronic component includes a plurality of dielectric layers made of a ceramic material and internal electrodes interposed therebetween. By disposing a multilayer ceramic electronic component within a board, an embedded multilayer ceramic electronic component having high capacitance may be implemented.

In order to manufacture a printed circuit board (PCB) including an embedded multilayer ceramic electronic component, a multilayer ceramic electronic component may be inserted into a core board, and via holes are required to be formed in an upper stacked plate and a lower stacked plate by using a laser in order to connect board wirings and external electrodes of the multilayer ceramic electronic component. Laser beam machining, however, considerably increases manufacturing costs of a PCB.

Meanwhile, an embedded multilayer ceramic electronic component is installed in a core part within a board, so a nickel/tin (Ni/Sn) plated layer on external electrodes thereof is not required, unlike a general multilayer ceramic electronic component mounted on a surface of a board.

Namely, since external electrodes of an embedded multilayer ceramic electronic component are electrically connected to a circuit within a board through a via made of a copper (Cu) material, a copper (Cu) layer, rather than a nickel/tin (Ni/Sn) layer, is required to be formed on the external electrodes.

In general, external electrodes may include copper (Cu) as a main ingredient, but since external electrodes include glass, a component included in the glass may absorb a laser in the event of laser beam machining to form a via within a board, making it difficult to adjust a process depth of the via.

For this reason, a copper (Cu) plated layer is separately formed on external electrodes of an embedded multilayer ceramic electronic component.

However, forming the copper (Cu) plated layer increases cost and still causes the problem of degradation of reliability due to infiltration of a plating solution, and a solution thereto is still needed.

RELATED ART DOCUMENT (Patent Document 1) Korean Patent Laid-Open Publication No. 2006-0047733

SUMMARY

An aspect of the present disclosure may provide a multilayer ceramic electronic component to be embedded in a board and a printed circuit board having a multilayer ceramic electronic component embedded therein.

According to an aspect of the present disclosure, a multilayer ceramic electronic component to be embedded in a board may include: a ceramic body including dielectric layers and having first and second main surfaces opposing one another, first and second lateral surfaces opposing one another, and first and second end surfaces opposing one another; first internal electrodes and second internal electrodes stacked to be spaced apart from both end surfaces of the ceramic body at a predetermined distance with the dielectric layers interposed therebetween and having first and second leads exposed to the first and second lateral surfaces of the ceramic body, respectively; and first and second external electrodes formed in both end portions of the ceramic body, wherein the first and second external electrodes may include first and second base electrodes electrically connected to the first and second internal electrodes, respectively, and first and second terminal electrodes formed on the first and second base electrodes, respectively, and a non-conductive paste layer may be formed on both lateral surfaces of the ceramic body in which the first and second base electrodes are formed.

The non-conductive paste layer may include an epoxy resin.

The first external electrode may be formed on the first and second main surfaces and the first end surface of the ceramic body, and the second external electrode may be formed on the first and second main surfaces and the second end surface of the ceramic body.

The first and second terminal electrodes may be formed of copper (Cu).

According to another aspect of the present disclosure, a multilayer ceramic electronic component to be embedded in a board may include: a ceramic body including dielectric layers and having first and second main surfaces opposing one another, first and second lateral surfaces opposing one another, and first and second end surfaces opposing one another; first internal electrodes and second internal electrodes stacked to be spaced apart from both end surfaces of the ceramic body at a predetermined distance with the dielectric layers interposed therebetween and having first and second leads exposed to the first and second lateral surfaces of the ceramic body, respectively; and first and second external electrodes formed in both end portions of the ceramic body, wherein the first and second external electrodes may include first and second base electrodes electrically connected to the first and second internal electrodes, first and second conductive paste layers formed on the first and second base electrodes to cover the first and second leads in both lateral surfaces of the ceramic body, and first and second terminal electrodes formed on the first and second base electrodes and the first and second conductive paste layers.

The first external electrode may be formed on the first and second main surfaces and the first end surface of the ceramic body, and the second external electrode may be formed on the first and second main surfaces and the second end surface of the ceramic body.

The first and second terminal electrodes may be formed of copper (Cu).

According to another aspect of the present disclosure, a multilayer ceramic electronic component to be embedded in a board may include: a ceramic body including dielectric layers and having first and second main surfaces opposing one another, first and second lateral surfaces opposing one another, and first and second end surfaces opposing one another; first internal electrodes and second internal electrodes stacked to be spaced apart from both end surfaces of the ceramic body at a predetermined distance with the dielectric layers interposed therebetween and having first and second leads exposed to the first and second lateral surfaces of the ceramic body, respectively; and first and second external electrodes formed in both end portions of the ceramic body, wherein portions of the first and second leads of the first internal electrodes and the first and second leads of the second internal electrodes may overlap, the first and second external electrodes may include first and second base electrodes electrically connected to the first and second internal electrodes, respectively, and first and second terminal electrodes formed on the first and second base electrodes, respectively, a non-conductive paste layer may be formed on both lateral surfaces of the ceramic body in which the first and second base electrodes are formed, and the first and second base electrodes may be formed to be spaced apart at a predetermined distance from the region in which the first and second leads overlap.

The non-conductive paste layer may include an epoxy resin.

The first external electrode may be formed on the first and second main surfaces and the first end surface of the ceramic body, and the second external electrode may be formed on the first and second main surfaces and the second end surface of the ceramic body.

The first and second terminal electrodes may be formed of copper (Cu).

According to another aspect of the present disclosure, a multilayer ceramic electronic component to be embedded in a board may include: a ceramic body including dielectric layers and having first and second main surfaces opposing one another, first and second lateral surfaces opposing one another, and first and second end surfaces opposing one another; first internal electrodes and second internal electrodes stacked to be spaced apart from both end surfaces of the ceramic body at a predetermined distance with the dielectric layers interposed therebetween and having first and second leads exposed to the first and second lateral surfaces of the ceramic body, respectively; and first and second external electrodes formed in both end portions of the ceramic body, wherein the first and second leads of the first internal electrodes and the first and second leads of the second internal electrodes may be formed to be spaced apart from one another at a predetermined distance, the first and second external electrodes may include first and second base electrodes electrically connected to the first and second internal electrodes, respectively, and first and second terminal electrodes formed on the first and second base electrodes, respectively, a non-conductive paste layer may be formed on both lateral surfaces of the ceramic body in which the first and second base electrodes are formed, and the first and second base electrodes may be formed in portions of the first and second leads.

The non-conductive paste layer may include an epoxy resin.

The first external electrode may be formed on the first and second main surfaces and the first end surface of the ceramic body, and the second external electrode may be formed on the first and second main surfaces and the second end surface of the ceramic body.

The first and second terminal electrodes may be formed of copper (Cu).

According to another aspect of the present disclosure, a multilayer ceramic electronic component to be embedded in a board may include: a ceramic body including dielectric layers and having first and second main surfaces opposing one another, first and second lateral surfaces opposing one another, and first and second end surfaces opposing one another; first internal electrodes and second internal electrodes formed to be alternately exposed to both lateral surfaces of the ceramic body with the dielectric layers interposed therebetween and having first and second leads exposed to the first and second end surfaces of the ceramic body, respectively; and a first external electrode formed on the first lateral surface of the ceramic body and a second external electrode formed on the second lateral surface of the ceramic body, wherein portions of the first and second leads of the first internal electrodes and portions of the first and second leads of the second internal electrodes may overlap, the first and second external electrodes may include first and second base electrodes electrically connected to the first and second internal electrodes, respectively, and first and second terminal electrodes formed on the first and second base electrodes, respectively, a non-conductive paste layer may be formed on both end surfaces of the ceramic body in which the first and second base electrodes are formed, and the first and second base electrodes may be formed to be spaced apart at a predetermined distance from the region in which the first and second leads overlap.

The non-conductive paste layer may include an epoxy resin.

The first external electrode may be formed on the first and second main surfaces and the first lateral surface of the ceramic body, and the second external electrode may be formed on the first and second main surfaces and the second lateral surface of the ceramic body.

The first and second terminal electrodes may be formed of copper (Cu).

According to another aspect of the present disclosure, a multilayer ceramic electronic component to be embedded in a board may include: a ceramic body including dielectric layers and having first and second main surfaces opposing one another, first and second lateral surfaces opposing one another, and first and second end surfaces opposing one another; first internal electrodes and second internal electrodes formed to be alternately exposed to both lateral surfaces of the ceramic body with the dielectric layers interposed therebetween and having first and second leads exposed to the first and second end surfaces of the ceramic body, respectively; and a first external electrode formed on the first lateral surface of the ceramic body and a second external electrode formed on the second lateral surface of the ceramic body, wherein the first and second leads of the first internal electrodes and the first and second leads of the second internal electrodes may be formed to be spaced apart from one another at a predetermined distance, the first and second external electrodes may include first and second base electrodes electrically connected to the first and second internal electrodes, respectively, and first and second terminal electrodes formed on the first and second base electrodes, respectively, a non-conductive paste layer may be formed on both end surfaces of the ceramic body in which the first and second base electrodes are formed, and the first and second base electrodes may be formed in portions of the first and second leads.

The non-conductive paste layer may include an epoxy resin.

The first external electrode may be formed on the first and second main surfaces and the first lateral surface of the ceramic body, and the second external electrode may be formed on the first and second main surfaces and the second lateral surface of the ceramic body.

The first and second terminal electrodes may be formed of copper (Cu).

According to another aspect of the present disclosure, a printed circuit board (PCB) having a multilayer ceramic electronic component embedded therein may include: an insulating board; and a multilayer ceramic electronic component mentioned above formed in the insulating board.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
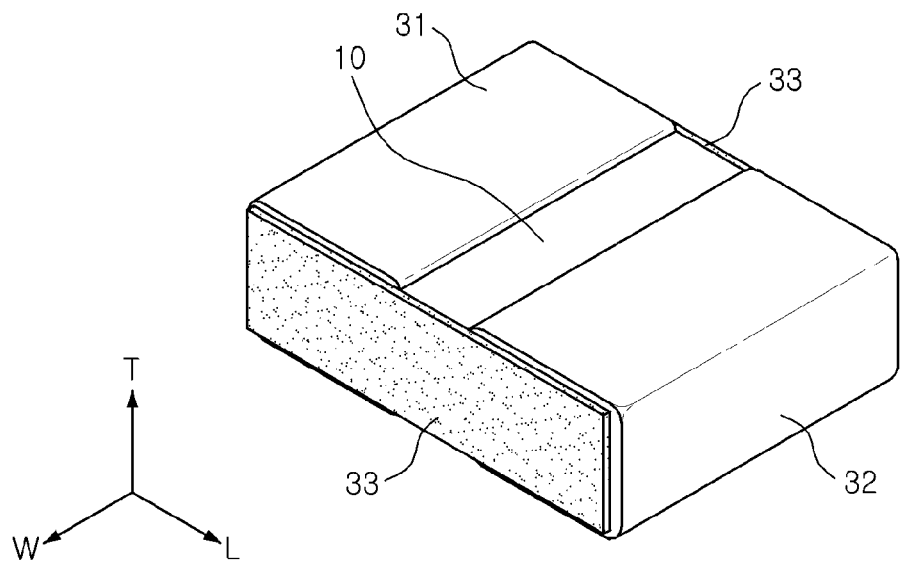
FIG. 1 is a perspective view illustrating a multilayer ceramic electronic component to be embedded in a board according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a perspective view illustrating a multilayer ceramic electronic component to be embedded in a board according to an exemplary embodiment of the present disclosure.

Figure 2:
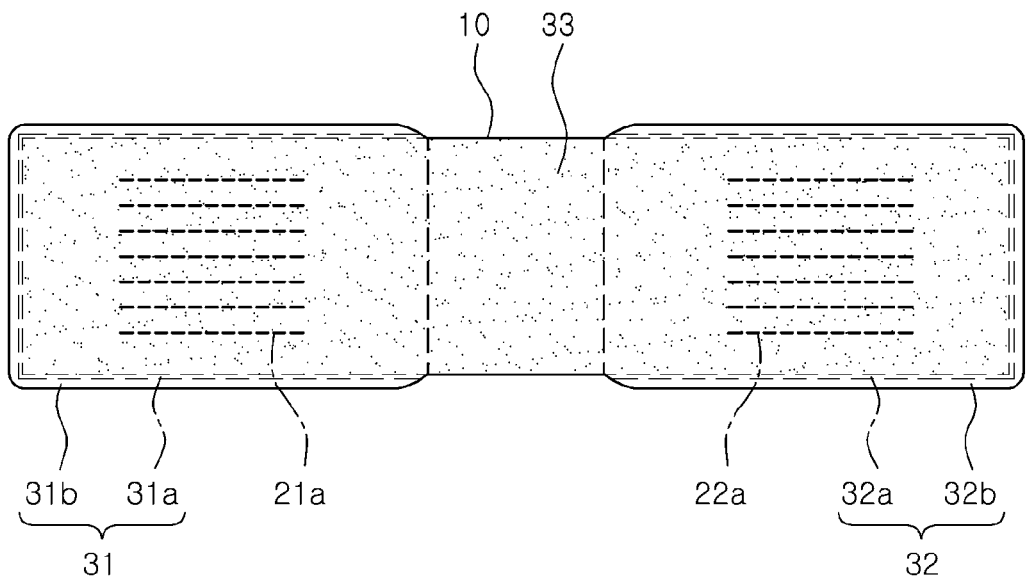
FIG. 2 is a side view of the multilayer ceramic electronic component to be embedded in a board of FIG. 1.

FIG. 2 is a side view of the multilayer ceramic electronic component to be embedded in a board of FIG. 1.

Figure 3:
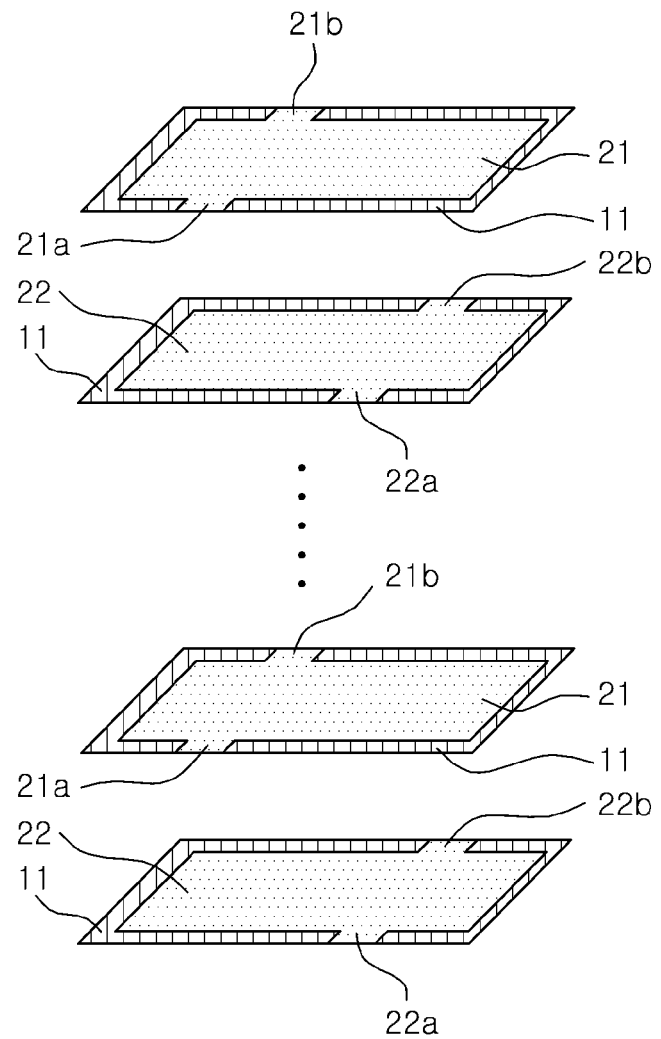
FIG. 3 is an exploded perspective view illustrating patterns of first and second internal electrodes according to an exemplary embodiment of the present disclosure.

FIG. 3 is an exploded perspective view illustrating patterns of first and second internal electrodes according to an exemplary embodiment of the present disclosure.

Referring to FIGS. 1 through 3, the multilayer ceramic electronic component to be embedded in a board according to the exemplary embodiment of the present disclosure may include a ceramic body 10 including dielectric layers 11 and having first and second main surfaces opposing one another, first and second lateral surfaces opposing one another, and first and second end surfaces opposing one another; first internal electrodes 21 and second internal electrodes 22 stacked to be spaced apart from both end surfaces of the ceramic body 10 at a predetermined distance with the dielectric layers 11 interposed therebetween and having first leads 21a and 21b and second leads 22a and 22b exposed to the first and second lateral surfaces of the ceramic body 10, respectively; and first and second external electrodes 31 and 32 formed in both end portions of the ceramic body 10, wherein the first and second external electrodes 31 and 32 may include first and second base electrodes 31a and 32a electrically connected to the first and second internal electrodes 21 and 22 and first and second terminal electrodes 31b and 32b formed on the first and second base electrodes 31a and 32a, respectively, and a non-conductive paste layer 33 may be formed on both lateral surfaces of the ceramic body 10 in which the first and second base electrodes 31a and 32a are formed.

Hereinafter, a multilayer ceramic electronic component according to the exemplary embodiment of the present disclosure will be described. In particular, a multilayer ceramic capacitor will be described, but the present disclosure is not limited thereto.

In the multilayer ceramic capacitor according to the exemplary embodiment of the present disclosure, it is defined that a "length direction" is the "L" direction, a "width direction" is the "W" direction, and a "thickness direction" is the "T" direction in FIG. 1. Here, the "thickness direction" may be used to refer to the same concept as a "stacked direction" in which dielectric layers are stacked.

In the exemplary embodiment of the present disclosure, the ceramic body 10 may have a hexahedral shape as illustrated, but a shape of the ceramic body 10 is not particularly limited.

In the exemplary embodiment of the present disclosure, the ceramic body 10 may have the first and second main surfaces opposing one another, the first and second lateral surfaces opposing one another, and the first and second end surfaces opposing one another, and the first and second main surfaces may also be described as upper and lower surfaces of the ceramic body 10.

In the exemplary embodiment of the present disclosure, a material used to form the dielectric layers 11 is not particularly limited as long as it may obtain sufficient capacitance. For example, barium titanate ($BaTiO_3$) powder may be used.

For the material of the dielectric layers 11, various ceramic additives, organic solvent, plasticizer, bonder, dispersing agent, and the like, may be added to the barium titanate ($BaTiO_3$) powder, or the like, according to purposes of the present disclosure.

An average particle diameter of the ceramic powder used to form the dielectric layers 11 is not particularly limited and may be adjusted to achieve the purpose of the present disclosure. For example, the average particle diameter of the ceramic powder may be adjusted to be less than or equal to 400 nm.

A material used to form the first and second internal electrodes 21 and 22 is not particularly limited. For example, the first and second internal electrodes 21 and 22 may be formed of conductive paste including one or more materials among precious metals such as palladium (Pd), a palladium-silver (Pd—Ag) alloy, and the like, nickel, and copper.

According to the exemplary embodiment of the present disclosure, the first internal electrodes 21 are stacked while being spaced apart from both end surfaces of the ceramic body 10 at a predetermined distance and have first and second leads 21a and 21b exposed to the first and second lateral surfaces of the ceramic body 10.

Also, the second internal electrodes 22 are stacked while being spaced apart from both end surfaces of the ceramic body 10 at a predetermined distance and have first and second leads 22a and 22b exposed to the first and second lateral surfaces of the ceramic body 10.

The first and second internal electrodes 21 and 22 may be electrically connected to the first and second external electrodes 31 and 32 described below through the first and second leads 21a, 21b, 22a, and 22b exposed to the first and second lateral surfaces of the ceramic body 10.

Thus, compared to a general configuration in which internal electrodes are connected to external electrodes through both end surfaces of a ceramic body, since the internal electrodes 21 and 22 extend to the upper and lower surfaces of the ceramic body 10 so as to be exposed, a current path may be shortened to reduce equivalent series inductance (ESL).

According to the exemplary embodiment of the present disclosure, the first and second external electrodes 31 and 32 may be formed on both end surfaces of the ceramic body 10.

The first external electrode 31 may be formed on the first and second main surfaces and the first end surface of the ceramic body 10, and the second external electrode 32 may be formed on the first and second main surfaces and the second end surface of the ceramic body 10.

The first external electrode 31 may include the first base electrode 31a electrically connected to the first internal electrode 21 and the first terminal electrode 31b formed on the first base electrode 31a.

Also, the second external electrode 32 may include the second base electrode 32a electrically connected to the second internal electrode 22 and the second terminal electrode 32b formed on the second base electrode 32a.

Meanwhile, the Multilayer Ceramic Capacitor according to the exemplary embodiment of the present disclosure may include a non-conductive paste layer 33 formed on both lateral surfaces of the ceramic body 10 in which the first and second base electrodes 31a and 32a are formed.

Hereinafter, the structures of the first and second external electrodes 31 and 32 and the non-conductive paste layer 33 will be described in detail.

The first and second base electrodes 31a and 32a may include a conductive metal and glass.

In order to form capacitance, the first and second external electrodes 31 and 32 may be formed on both end surfaces of the ceramic body 10, and the first and second base electrodes 31a and 32a of the first and second external electrodes 31 and 32 may be electrically connected to the first and second internal electrodes 21 and 22.

The first and second base electrodes 31a and 32a may be formed of a conductive material identical to that of the first and second internal electrodes 21 and 22, but the present disclosure is not limited thereto. For example, the first and second base electrodes 31a and 32a may be formed of one or more conductive metals selected from the group consisting of copper (Cu), silver (Ag), nickel (Ni), and an alloy thereof.

The first and second base electrodes 31a and 32a may be formed by applying a conductive paste prepared by adding glass frit to the conductive metal powder and sintering the same.

Referring to FIG. 2, the first and second base electrodes 31a and 32a may be formed to cover the first and second leads 21a and 21b of the first internal electrodes and the first and second leads 22a and 22b of the second internal electrodes 22 each exposed to the lateral surfaces of the ceramic body 10.

Also, the non-conductive paste layer 33 may be formed on both lateral surfaces of the ceramic body 10 in which the first and second base electrodes 31a and 32a are formed.

The non-conductive paste layer 33 may be formed by applying a paste including an epoxy resin, for example, but the present inventive concept is not particularly limited thereto.

According to the exemplary embodiment of the present disclosure, the first and second external electrodes 31 and 32 may include the first and second terminal electrodes 31b and 32b formed on the first and second base electrodes 31a and 32a, respectively. The first terminal electrode 31b may be formed on the first and second main surfaces and the first end surface of the ceramic body 10, and the second terminal electrode 32b may be formed on the first and second main surfaces and the second end surface of the ceramic body 10.

The first and second terminal electrodes 31b and 32b may be formed of copper (Cu).

In general, since a multilayer ceramic capacitor is mounted on a printed circuit board (PCB), a nickel/tin plated layer is generally formed on external electrodes.

In comparison, the multilayer ceramic capacitor according to the exemplary embodiment of the present disclosure is to be embedded in a PCB not mounted on a board, and the first and second external electrodes 31 and of the multilayer ceramic capacitor are electrically connected to a circuit of the board through a via made of copper (Cu).

Thus, in the exemplary embodiment of the present disclosure, a metal layer made of copper (Cu) having good electrical connectivity with copper (Cu), a material of the via of the board, may be further formed on the first and second external electrodes 31 and 32.

The external electrodes 31 and 32 also include copper (Cu) as a main ingredient, but since the external electrodes 31 and 32 include glass, a component included in the glass may absorb the laser in the event of laser beam machining to form a via within a board, making it impossible to adjust a process depth of the via.

Thus, in the exemplary embodiment of the present disclosure, the foregoing problem may be solved by forming the first and second terminal electrodes 31b and 32b formed of copper (Cu) on the first and second base electrodes 31a and 32a.

A method for forming the first and second terminal electrodes 31b and 32b with copper (Cu) is not particularly limited. For example, the first and second terminal electrodes 31b and 32b may be formed through plating.

In this case, however, the formation of the copper (Cu) plated layer may cause a plating solution to infiltrate the ceramic body, degrading reliability.

Thus, in the exemplary embodiment of the present disclosure, the non-conductive paste layer 33 may be formed on both lateral surfaces of the ceramic body 10, in which the first and second base electrodes 31a and 32a are formed, to solve the foregoing problem.

Specifically, since the first and second terminal electrodes 31b and 32b are formed through plating, the first and second terminal electrodes 31b and 32b may be formed on the first and second base electrodes 31a and 32a but not on both of the lateral surfaces of the ceramic body 10 in which the non-conductive paste layer 33 without a metal component is formed.

Thus, in the exemplary embodiment of the present disclosure, a plating solution may not infiltrate the lateral surfaces of the ceramic body 10 to which the first and second leads 21a and 21b of the first internal electrodes 21 and the first and second leads 22a and 22b of the second internal electrodes 22 are exposed, addressing the problem caused by plating.

Thus, without the problem caused by the plating, the first and second base electrodes 31a and 32a may be formed to be thinner, and electronic components may be miniaturized.

In addition, after sintering, the first and second terminal electrodes 31b and 32b are formed only of copper (Cu) without any glass frit, such that the problem in which a component included in the glass absorbs the laser in the event of laser beam machining to form a via within a board, making it impossible to adjust a process depth of the via, may not occur.

Figure 4:
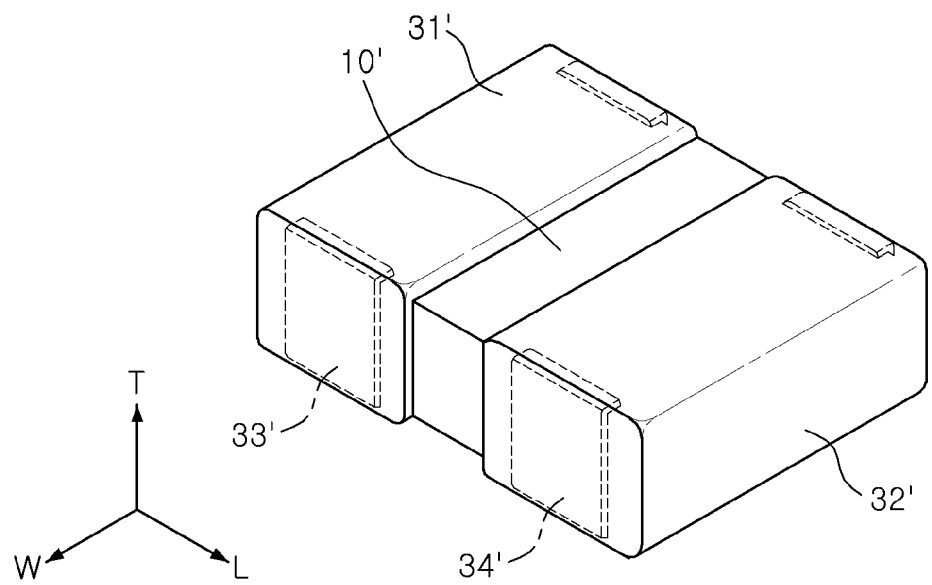
FIG. 4 is a perspective view illustrating a multilayer ceramic electronic component to be embedded in a board according to another exemplary embodiment of the present disclosure.

FIG. 4 is a perspective view illustrating a multilayer ceramic electronic component to be embedded in a board according to another exemplary embodiment of the present disclosure.

Figure 5:
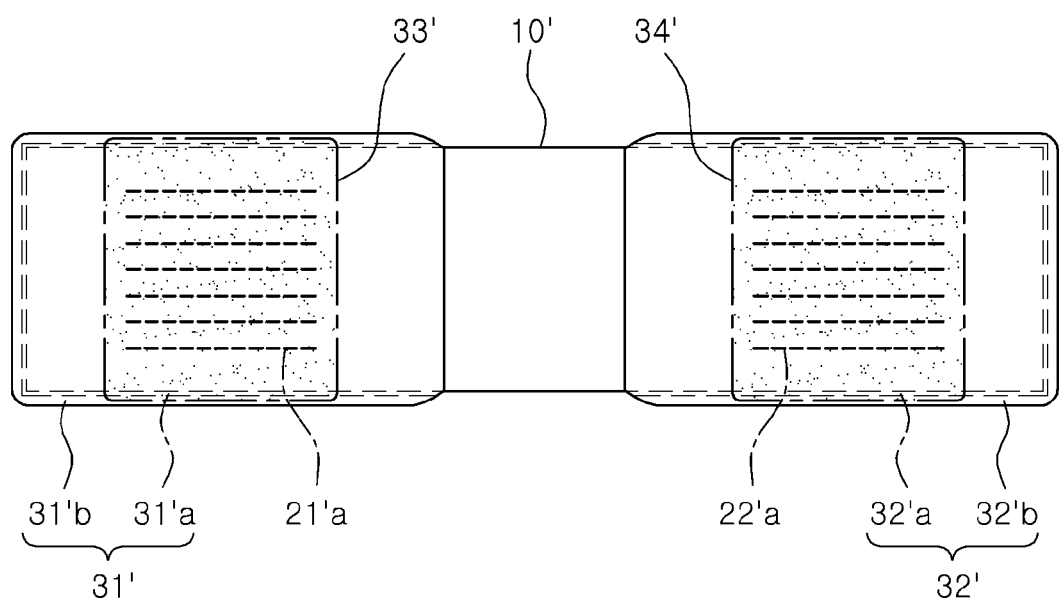
FIG. 5 is a side view of the multilayer ceramic electronic component to be embedded in a board of FIG. 4.

FIG. 5 is a side view of the multilayer ceramic electronic component to be embedded in a board of FIG. 4.

Figure 6:
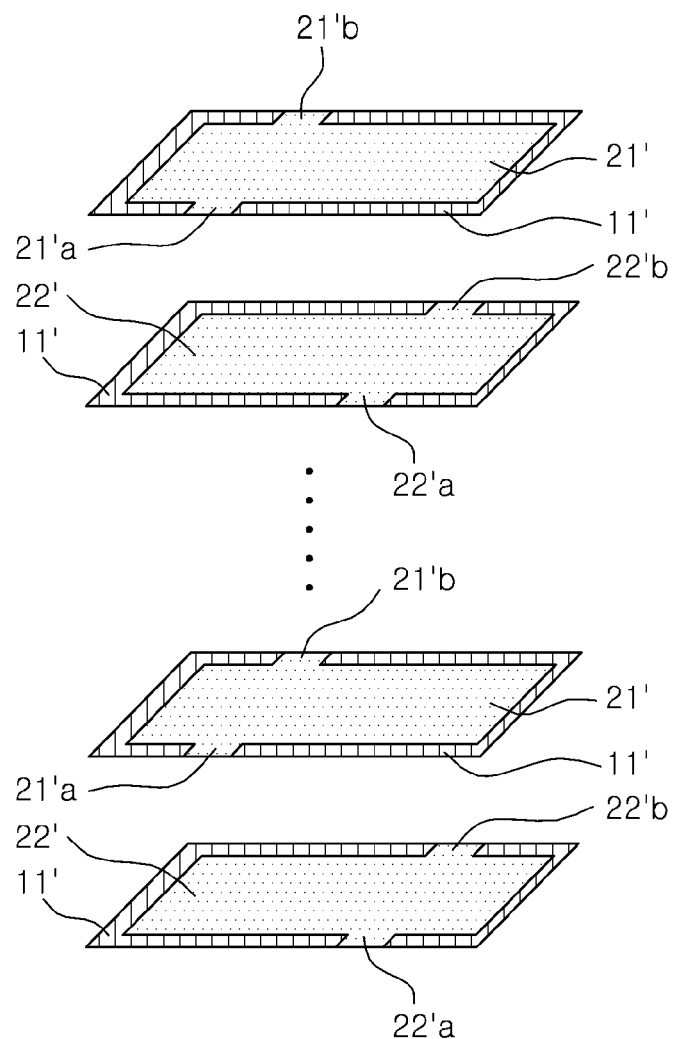
FIG. 6 is an exploded perspective view illustrating patterns of first and second internal electrodes according to another exemplary embodiment of the present disclosure.

FIG. 6 is an exploded perspective view illustrating patterns of first and second internal electrodes according to another exemplary embodiment of the present disclosure.

Referring to FIGS. 4 through 6, the multilayer ceramic electronic component to be embedded in a board according to the exemplary embodiment of the present disclosure may include a ceramic body 10' including dielectric layers 11' and having first and second main surfaces opposing one another, first and second lateral surfaces opposing one another, and first and second end surfaces opposing one another; first and second internal electrodes 21' and second internal electrodes 22' stacked to be spaced apart from both end surfaces of the ceramic body 10' at a predetermined distance with the dielectric layers 11' interposed therebetween and having first and second leads 21'a, 21'b, 22'a, and 22'b exposed to the first and second lateral surfaces of the ceramic body 10', respectively; and first and second external electrodes 31' and 32' formed in both end portions of the ceramic body 10', wherein the first and second external electrodes 31' and 32' may include first and second base electrodes 31'a and 32'a electrically connected to the first and second internal electrodes 21' and 22', first and second conductive paste layers 33' and 34' formed on the first and second base electrodes 31'a and 32'a to cover the first and second leads 21'a, 21'b, 22'a, and 22'b in both lateral surfaces of the ceramic body 10', and first and second terminal electrodes 31'b and 32'b formed on the first and second base electrodes 31'a and 32'a and the first and second conductive paste layers 33' and 34'.

According to the present exemplary embodiment, the first internal electrodes 21' are stacked to be spaced apart from both end surfaces of the ceramic body 10' at a predetermined distance and have first and second leads 21'a and 21'b exposed to the first and second lateral surfaces of the ceramic body 10'.

Also, the second internal electrodes 22' are stacked to be spaced apart from both end surfaces of the ceramic body 10' at a predetermined distance and have first and second leads 22'a and 22'b exposed to the first and second lateral surfaces of the ceramic body 10'.

According to the exemplary embodiment of the present disclosure, the first and second external electrodes 31' and 32' may be formed on both end surfaces of the ceramic body 10'.

Also, the first external electrode 31' may be formed on the first and second main surfaces and the first end surface of the ceramic body 10', and the second external electrode 32' may be formed on the first and second main surfaces and the second end surface of the ceramic body 10'.

The first external electrode 31' may include the first conductive paste layer 33' formed on the first base electrode 31'a to cover the first and second leads 21'a and 21'b in both lateral surfaces of the ceramic body 10', the first base electrode 31'a, and the first terminal electrode 31'b formed on the first conductive paste layer 33'.

The second external electrode 32' may include the second conductive paste layer 34' formed on the second base electrode 32'a to cover the first and second leads 22'a and 22'b in both lateral surfaces of the ceramic body 10', the second base electrode 32'a, and the second terminal electrode 32'b formed on the second conductive paste layer 34'.

Hereinafter, the structures of the first and second external electrodes 31' and 32' and the first and second conductive paste layers 33' and 34' will be described in detail.

Referring to FIG. 5, the first and second base electrodes 31'a and 32'a may be formed to cover the first and second leads 21'a and 21'b of the first internal electrodes 21' and the first and second leads 22a' and 22b' of the second internal electrodes 22' exposed to the lateral surfaces of the ceramic body 10'.

The first and second conductive paste layers 33' and 34' may be formed on the first and second base electrodes 31'a and 32'a in order to cover the first and second leads 21a', 21'b, 22'a, and 22'b in both lateral surfaces of the ceramic body 10'.

According to the present exemplary embodiment, the first and second external electrodes 31' and 32' may include the first and second base electrodes 31'a and 32'a and the first and second terminal electrodes 31'b and 32'b formed on the first and second conductive paste layers 33' and 34'.

According to the present exemplary embodiment, the first and second conductive paste layers 33' and 34' may be formed on the first and second base electrodes 31'a and 32'a to cover the first and second leads 21'a, 21'b, 22'a, and 22'b in both lateral surfaces of the ceramic body 10', in order to solve a problem caused by infiltration of a plating solution.

Thus, since the problem caused by plating has been solved, the first and second base electrodes 31'a and 32'a may be formed to be thinner, and an electronic component may be miniaturized.

Other features of the multilayer ceramic electronic component are identical to those of the multilayer ceramic electronic component according to the former exemplary embodiment of the present disclosure as described above, so descriptions thereof will be omitted.

Figure 7:
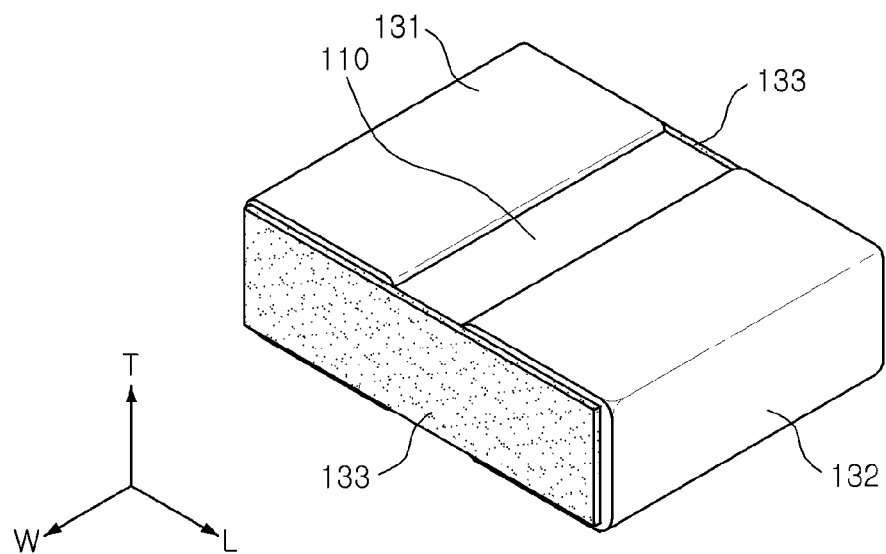
FIG. 7 is a perspective view illustrating a multilayer ceramic electronic component to be embedded in a board according to another exemplary embodiment of the present disclosure.

FIG. 7 is a perspective view illustrating a multilayer ceramic electronic component to be embedded in a board according to another exemplary embodiment of the present disclosure.

Figure 8:
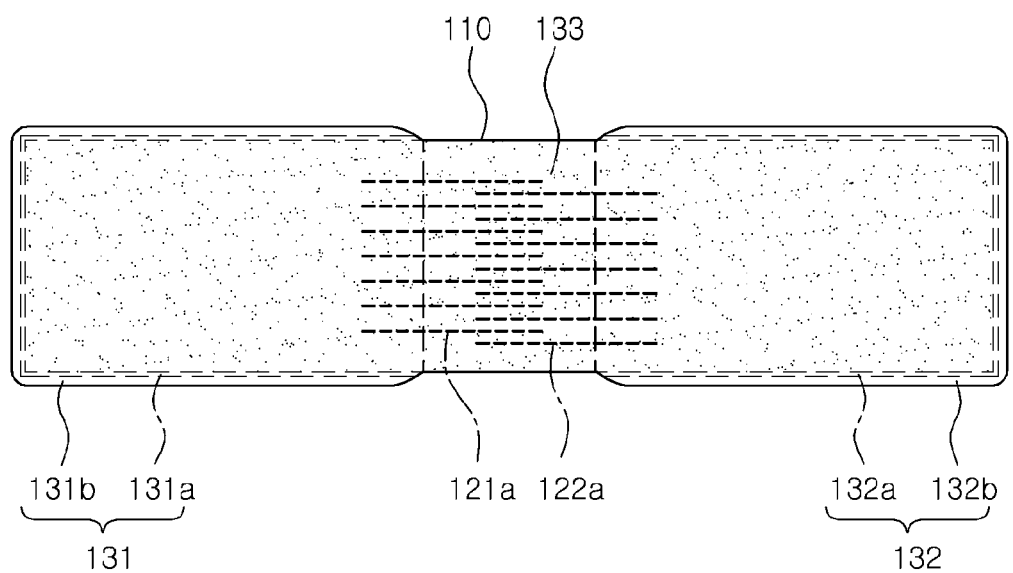
FIG. 8 is a side view of the multilayer ceramic electronic component to be embedded in a board of FIG. 7.

FIG. 8 is a side view of the multilayer ceramic electronic component to be embedded in a board of FIG. 7.

Figure 9:
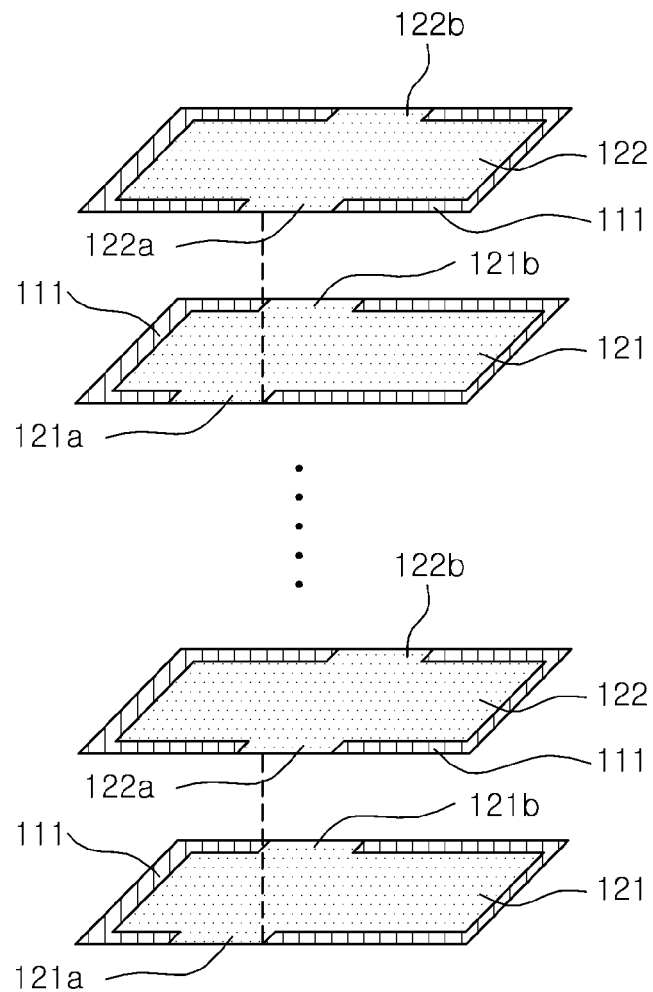
FIG. 9 is an exploded perspective view illustrating patterns of first and second internal electrodes according to another exemplary embodiment of the present disclosure.

FIG. 9 is an exploded perspective view illustrating patterns of first and second internal electrodes according to another exemplary embodiment of the present disclosure.

Referring to FIGS. 7 through 9, the multilayer ceramic electronic component to be embedded in a board according to the exemplary embodiment of the present disclosure may include a ceramic body 110 including dielectric layers 111 and having first and second main surfaces opposing one another, first and second lateral surfaces opposing one another, and first and second end surfaces opposing one another; first and second internal electrodes 121 and 122 stacked to be spaced apart from both end surfaces of the ceramic body 110 at a predetermined distance with the dielectric layers 111 interposed therebetween and having first and second leads 121a, 121b, 122a, and 122b exposed to the first and second lateral surfaces of the ceramic body 110, respectively; and first and second external electrodes 131 and 132 formed in both end portions of the ceramic body 110, wherein portions of the first and second leads 121a and 121b of the first internal electrodes 121 and the first and second leads 122a and 122b of the second internal electrodes 122 may overlap, the first and second external electrodes 131 and 132 may include first and second base electrodes 131a and 132a electrically connected to the first and second internal electrodes 121 and 122 and first and second terminal electrodes 131b and 132b formed on the first and second base electrodes 131a and 132a, respectively, a non-conductive paste layer 133 may be formed on both lateral surfaces of the ceramic body 110 in which the first and second base electrodes 131a and 132a are formed, and the first and second base electrodes 131a and 132a may be formed to be spaced apart at a predetermined distance from the region in which the first and second leads 121a, 121b, 122a, and 122b overlap.

According to the present exemplary embodiment, the first internal electrodes 121 are stacked to be spaced apart from both end surfaces of the ceramic body 110 at a predetermined distance and have the first and second leads 121a and 121b exposed to the first and second lateral surfaces of the ceramic body 110.

Also, the second internal electrodes 122 are stacked to be spaced apart from both end surfaces of the ceramic body 110 at a predetermined distance and have the first and second leads 122a and 122b exposed to the first and second lateral surfaces of the ceramic body 110.

The first and second leads 121a and 121b of the first internal electrodes 121 and the first and second leads 122a and 122b of the second internal electrodes 122 may partially overlap.

According to the present exemplary embodiment, the first and second external electrodes 131 and 132 may be formed on both end surfaces of the ceramic body 110.

The first external electrode 131 may be formed on the first and second main surfaces and the first end surface of the ceramic body 110, and the second external electrode 132 may be formed on the first and second main surfaces and the second end surface of the ceramic body 110.

The first external electrode 131 may include the first base electrode 131a electrically connected to the first internal electrode 121 and the first terminal electrode 131b formed on the first base electrode 131a.

The second external electrode 132 may include the second base electrode 132a electrically connected to the second internal electrode 122 and the second terminal electrode 132b formed on the second base electrode 132a.

Meanwhile, the multilayer ceramic electronic component to be embedded in a board according to the present exemplary embodiment may include the non-conductive paste layer 133 formed on both lateral surfaces of the ceramic body 110 in which the first and second base electrodes 131a and 132a are formed.

Hereinafter, the structures of the first and second external electrodes 131 and 132 and the non-conductive paste layer 133 will be described in detail.

Referring to FIG. 8, the first and second base electrodes 131a and 132a may be formed to be spaced apart at a predetermined distance from the region in which the first and second leads 121a, 121b, 122a, and 122b overlap.

Also, the non-conductive paste layer 133 may be formed on both lateral surfaces of the ceramic body 110 in which the first and second base electrodes 131a and 132a are formed.

Other features of the multilayer ceramic electronic component are identical to those of the multilayer ceramic electronic component according to the former exemplary embodiment of the present disclosure as described above, so descriptions thereof will be omitted.

Figure 10:
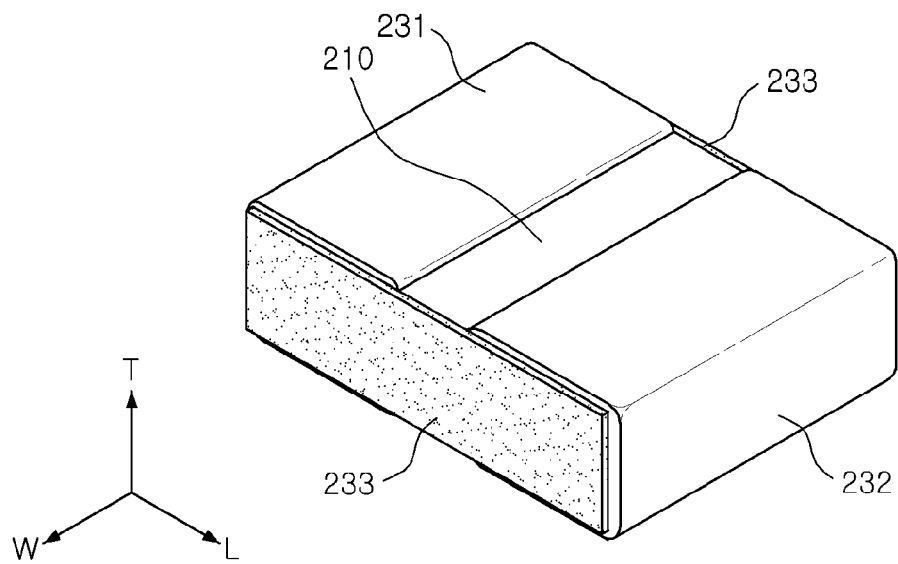
FIG. 10 is a perspective view illustrating a multilayer ceramic electronic component to be embedded in a board according to another exemplary embodiment of the present disclosure.

FIG. 10 is a perspective view illustrating a multilayer ceramic electronic component to be embedded in a board according to another exemplary embodiment of the present disclosure.

Figure 11:
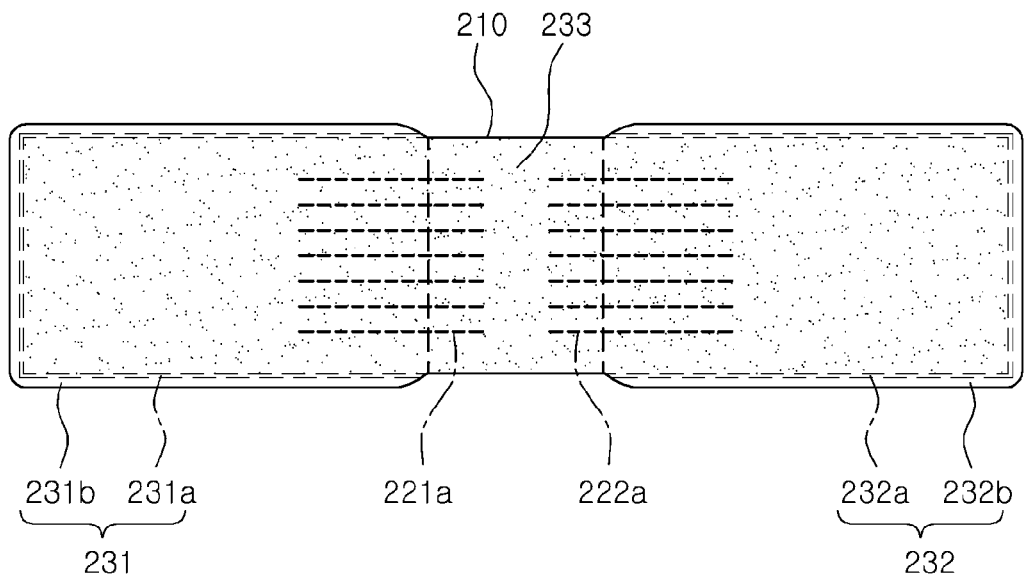
FIG. 11 is a side view of the multilayer ceramic electronic component to be embedded in a board of FIG. 10.

FIG. 11 is a side view of the multilayer ceramic electronic component to be embedded in a board of FIG. 10.

Figure 12:
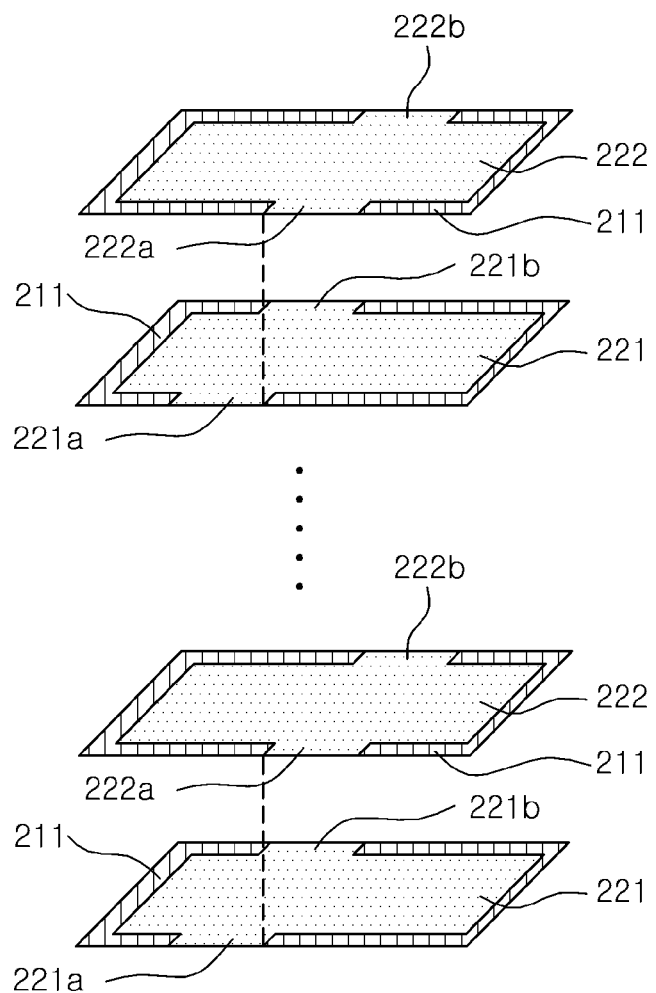
FIG. 12 is an exploded perspective view illustrating patterns of first and second internal electrodes according to another exemplary embodiment of the present disclosure.

FIG. 12 is an exploded perspective view illustrating patterns of first and second internal electrodes according to another exemplary embodiment of the present disclosure.

Referring to FIGS. 10 through 12, the multilayer ceramic electronic component to be embedded in a board according to the exemplary embodiment of the present disclosure may include a ceramic body 210 including dielectric layers 211 and having first and second main surfaces opposing one another, first and second lateral surfaces opposing one another, and first and second end surfaces opposing one another; first and second internal electrodes 221 and 222 stacked to be spaced apart from both end surfaces of the ceramic body 210 at a predetermined distance with the dielectric layers 211 interposed therebetween and having first and second leads 221a, 221b, 222a, and 222b exposed to the first and second lateral surfaces of the ceramic body 210, respectively; and first and second external electrodes 231 and 232 formed in both end portions of the ceramic body 210, wherein the first and second leads 221a and 221b of the first internal electrodes 221 and the first and second leads 222a and 222b of the second internal electrodes 222 may be formed to be spaced apart from one another at a predetermined distance, the first and second external electrodes 231 and 232 may include first and second base electrodes 231a and 232a electrically connected to the first and second internal electrodes 221 and 222 and first and second terminal electrodes 231b and 232b formed on the first and second base electrodes 231a and 232a, respectively, a non-conductive paste layer 233 may be formed on both lateral surfaces of the ceramic body 210 in which the first and second base electrodes 231a and 232a are formed, and the first and second base electrodes 231a and 232a may be formed in portions of the first and second leads 221a, 221b, 222a, and 222b.

According to the present exemplary embodiment, the first internal electrodes 221 are stacked to be spaced apart from both end surfaces of the ceramic body 210 at a predetermined distance and have the first and second leads 221a and 221b exposed to the first and second lateral surfaces of the ceramic body 210.

Also, the second internal electrodes 222 are stacked to be spaced apart from both end surfaces of the ceramic body 210 at a predetermined distance and have the first and second leads 222a and 222b exposed to the first and second lateral surfaces of the ceramic body 210.

The first and second leads 221a and 221b of the first internal electrodes 221 and the first and second leads 222a and 222b of the second internal electrodes 222 may be formed to be spaced apart from one another at a predetermined distance.

According to the present exemplary embodiment, the first and second external electrodes 231 and 232 may be formed on both end surfaces of the ceramic body 210.

The first external electrode 231 may be formed on the first and second main surfaces and the first end surface of the ceramic body 210, and the second external electrode 232 may be formed on the first and second main surfaces and the second end surface of the ceramic body 210.

The first external electrode 231 may include the first base electrode 231a electrically connected to the first internal electrode 221 and the first terminal electrode 231b formed on the first base electrode 231a.

The second external electrode 232 may include the second base electrode 232a electrically connected to the second internal electrode 222 and the second terminal electrode 232b formed on the second base electrode 232a.

Meanwhile, the multilayer ceramic electronic component to be embedded in a board according to the present exemplary embodiment may include the non-conductive paste layer 233 formed on both lateral surfaces of the ceramic body 210 in which the first and second base electrodes 231a and 232a are formed.

Hereinafter, the structures of the first and second external electrodes 231 and 232 and the non-conductive paste layer 233 will be described in detail.

Referring to FIG. 11, the first and second base electrodes 231a and 232a may be formed in portions of the first and second leads 221a, 221b, 222a, and 222b.

Namely, the first and second base electrodes 231a and 232a may not cover portions of the first and second leads 221a, 221b, 222a, and 222b in a direction of a central portion of the ceramic body 210.

Also, the non-conductive paste layer 233 may be formed on both lateral surfaces of the ceramic body 210 in which the first and second base electrodes 231a and 232a are formed.

Other features of the multilayer ceramic electronic component are identical to those of the multilayer ceramic electronic component according to the former exemplary embodiment of the present disclosure as described above, so descriptions thereof will be omitted.

Figure 13:
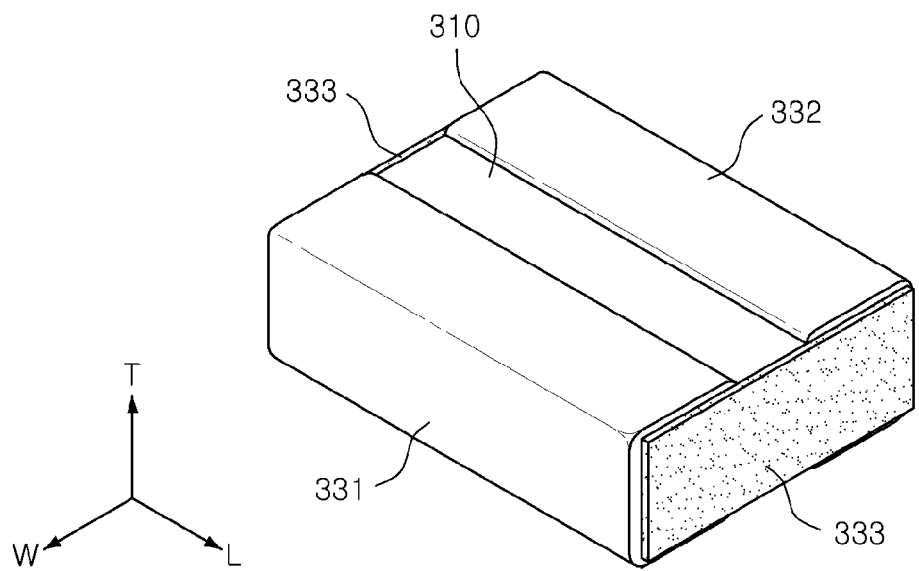
FIG. 13 is a perspective view illustrating a multilayer ceramic electronic component to be embedded in a board according to another exemplary embodiment of the present disclosure.

FIG. 13 is a perspective view illustrating a multilayer ceramic electronic component to be embedded in a board according to another exemplary embodiment of the present disclosure.

Figure 14:
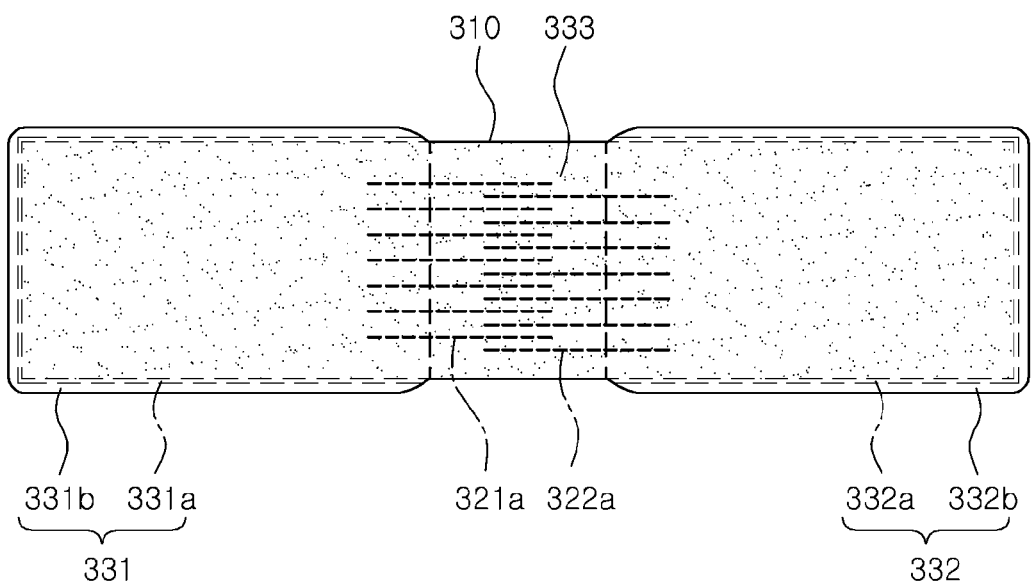
FIG. 14 is a side view of the multilayer ceramic electronic component to be embedded in a board of FIG. 13.

FIG. 14 is a side view of the multilayer ceramic electronic component to be embedded in a board of FIG. 13.

Figure 15:
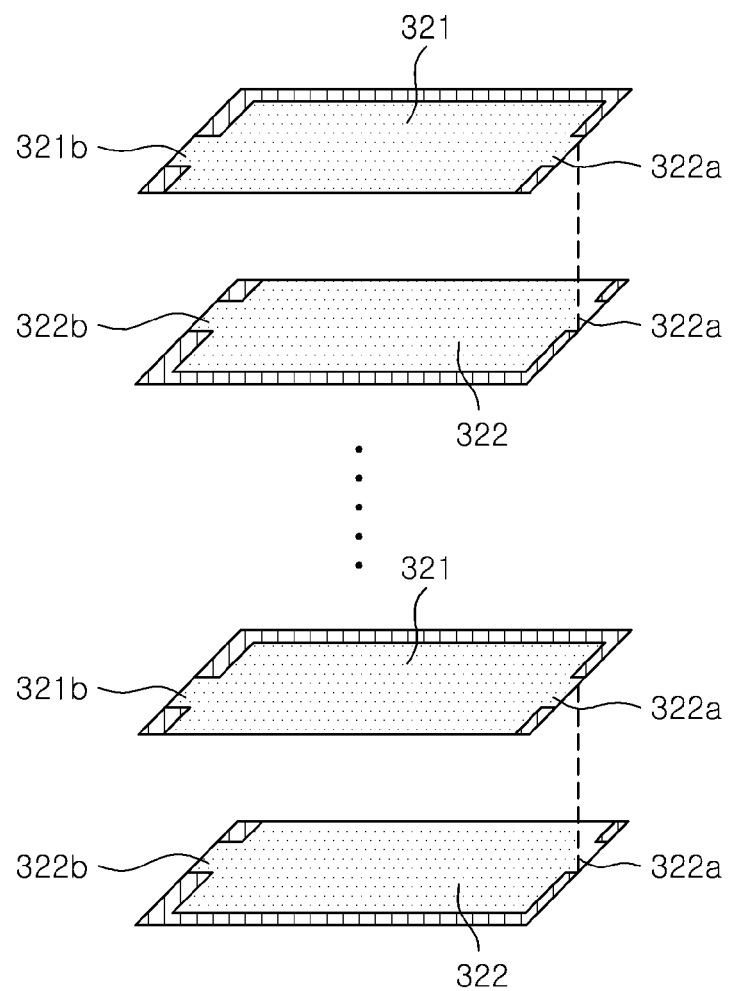
FIG. 15 is an exploded perspective view illustrating patterns of first and second internal electrodes according to another exemplary embodiment of the present disclosure.

FIG. 15 is an exploded perspective view illustrating patterns of first and second internal electrodes according to another exemplary embodiment of the present disclosure.

Referring to FIGS. 13 through 15, the multilayer ceramic electronic component to be embedded in a board according to the exemplary embodiment of the present disclosure may include a ceramic body 310 including dielectric layers 311 and having first and second main surfaces opposing one another, first and second lateral surfaces opposing one another, and first and second end surfaces opposing one another; first and second internal electrodes 321 and 322 formed to be alternately exposed to both lateral surfaces of the ceramic body 310 with the dielectric layers 311 interposed therebetween and having first and second leads 321a, 321b, 322a, and 322b exposed to the first and second end surfaces of the ceramic body 310, respectively; and a first external electrode 331 formed on the first lateral surface of the ceramic body 310 and a second external electrode 332 formed on the second lateral surface of the ceramic body 310, wherein portions of the first and second leads 321a and 321b of the first internal electrodes 321 and portions of the first and second leads 322a and 322b of the second internal electrodes 322 may overlap, the first and second external electrodes 331 and 332 may include first and second base electrodes 331a and 332a electrically connected to the first and second internal electrodes 321 and 322 and first and second terminal electrodes 331b and 332b formed on the first and second base electrodes 331a and 332a, respectively, a non-conductive paste layer 333 may be formed on both end surfaces of the ceramic body 310 in which the first and second base electrodes 331a and 332a are formed, and the first and second base electrodes 331a and 332a may be formed to be spaced apart at a predetermined distance from the region in which the first and second leads 321a, 321b, 322a, and 322b overlap.

According to the present exemplary embodiment, the first internal electrodes 321 are exposed to the first lateral surface of the ceramic body 310 and have the first and second leads 321a and 321b exposed to the first and second end surfaces of the ceramic body 310.

Also, the second internal electrodes 322 are exposed to the second lateral surface of the ceramic body 310 and have the first and second leads 322a and 322b exposed to the first and second end surfaces of the ceramic body 310.

The first and second leads 321a and 321b of the first internal electrodes 321 and the first and second leads 322a and 322b of the second internal electrodes 322 may partially overlap.

According to the present exemplary embodiment, the first and second external electrodes 331 and 332 may be formed on both lateral surfaces of the ceramic body 310.

The first external electrode 331 may be formed on the first and second main surfaces and the first lateral surface of the ceramic body 310, and the second external electrode 132 may be formed on the first and second main surfaces and the second lateral surface of the ceramic body 310.

The first external electrode 331 may include the first base electrode 331a electrically connected to the first internal electrode 321 and the first terminal electrode 331b formed on the first base electrode 331a.

The second external electrode 332 may include the second base electrode 332a electrically connected to the second internal electrode 322 and the second terminal electrode 332b formed on the second base electrode 332a.

Meanwhile, the multilayer ceramic electronic component to be embedded in a board according to the present exemplary embodiment may include the non-conductive paste layer 333 formed on both end surfaces of the ceramic body 310 in which the first and second base electrodes 331a and 332a are formed.

Hereinafter, the structures of the first and second external electrodes 331 and 332 and the non-conductive paste layer 333 will be described in detail.

FIG. 14 is a cross-sectional view illustrating the first end surface of the multilayer ceramic electronic component to be embedded in a board according to the present exemplary embodiment.

Referring to FIG. 14, the first and second base electrodes 331a and 332a may be formed to be spaced apart at a predetermined distance from the region in which the first and second leads 321a, 321b, 322a, and 322b overlap.

Also, the non-conductive paste layer 333 may be formed on both lateral surfaces of the ceramic body 310 in which the first and second base electrodes 331a and 332a are formed.

Other features of the multilayer ceramic electronic component are identical to those of the multilayer ceramic electronic component according to the former exemplary embodiment of the present disclosure as described above, so descriptions thereof will be omitted.

Figure 16:
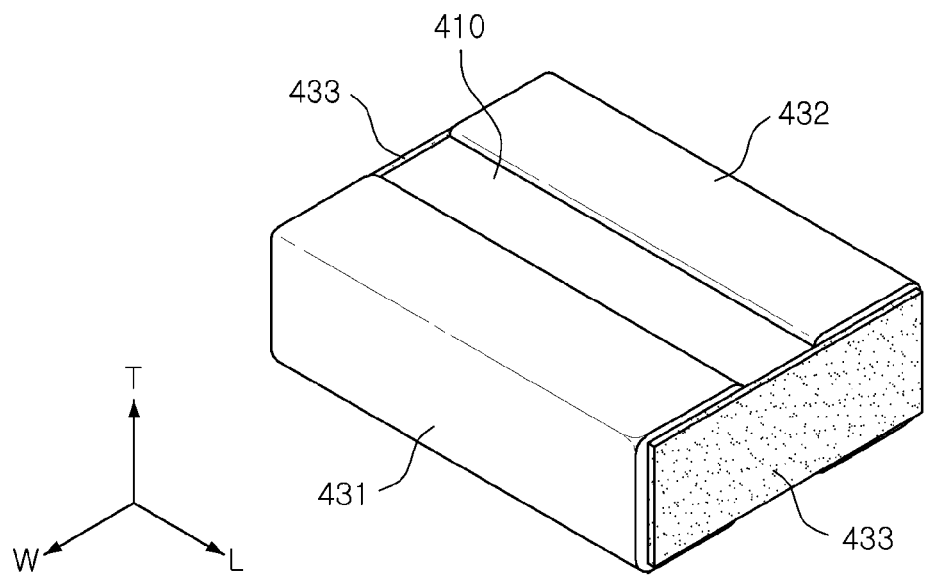
FIG. 16 is a perspective view illustrating a multilayer ceramic electronic component to be embedded in a board according to another exemplary embodiment of the present disclosure.

FIG. 16 is a perspective view illustrating a multilayer ceramic electronic component to be embedded in a board according to another exemplary embodiment of the present disclosure.

Figure 17:
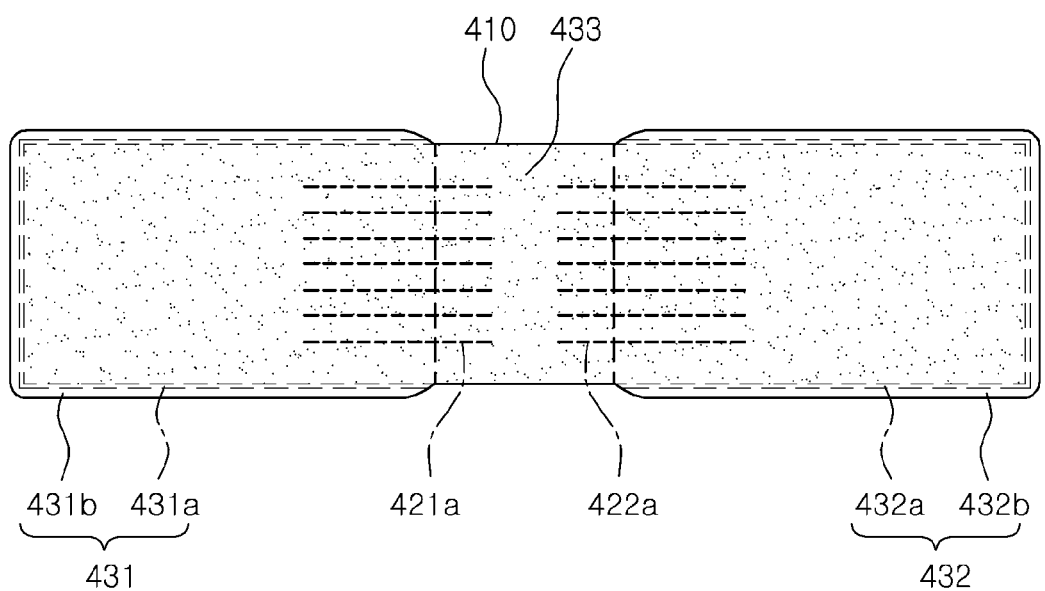
FIG. 17 is a side view of the multilayer ceramic electronic component to be embedded in a board of FIG. 16.

FIG. 17 is a side view of the multilayer ceramic electronic component to be embedded in a board of FIG. 16.

Figure 18:
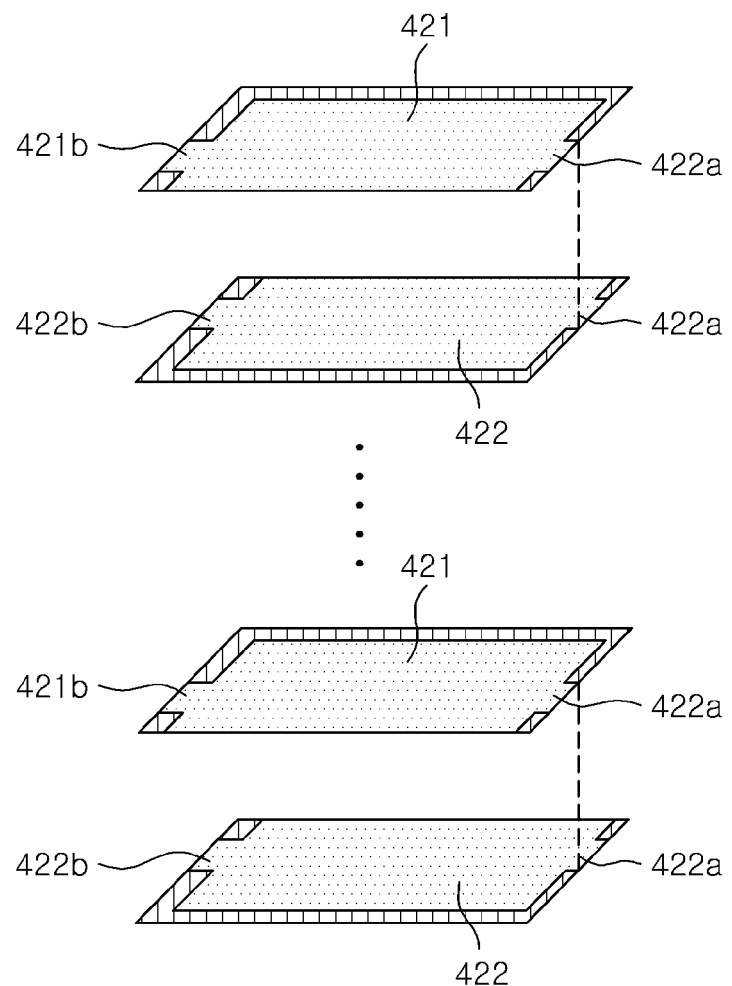
FIG. 18 is an exploded perspective view illustrating patterns of first and second internal electrodes according to another exemplary embodiment of the present disclosure.

FIG. 18 is an exploded perspective view illustrating patterns of first and second internal electrodes according to another exemplary embodiment of the present disclosure.

Referring to FIGS. 16 through 18, the multilayer ceramic electronic component to be embedded in a board according to the exemplary embodiment of the present disclosure may include a ceramic body 410 including dielectric layers 411 and having first and second main surfaces opposing one another, first and second lateral surfaces opposing one another, and first and second end surfaces opposing one another; first and second internal electrodes 421 and 422 formed to be alternately exposed to both lateral surfaces of the ceramic body 410 with the dielectric layers 411 interposed therebetween and having first and second leads 421a, 421b, 422a, and 422b exposed to the first and second end surfaces of the ceramic body 410, respectively; and a first external electrode 431 formed on the first lateral surface of the ceramic body 410 and a second external electrode 432 formed on the second lateral surface of the ceramic body 410, wherein the first and second leads 421a and 421b of the first internal electrodes 421 and the first and second leads 422a and 422b of the second internal electrodes 422 may be formed to be spaced apart from one another at a predetermined distance, the first and second external electrodes 431 and 432 may include first and second base electrodes 431a and 432a electrically connected to the first and second internal electrodes 421 and 422 and first and second terminal electrodes 431b and 432b formed on the first and second base electrodes 431a and 432a, respectively, a non-conductive paste layer 433 may be formed on both end surfaces of the ceramic body 410 in which the first and second base electrodes 431a and 432a are formed, and the first and second base electrodes 431a and 432a may be formed in portions of the first and second leads 421a, 421b, 422a, and 422b.

According to the present exemplary embodiment, the first internal electrodes 421 are exposed to the first lateral surface of the ceramic body 410 and have the first and second leads 421a and 421b exposed to the first and second end surfaces of the ceramic body 410.

Also, the second internal electrodes 422 are exposed to the second lateral surface of the ceramic body 410 and have the first and second leads 422a and 422b exposed to the first and second end surfaces of the ceramic body 410.

The first and second leads 421a and 421b of the first internal electrodes 421 and the first and second leads 422a and 422b of the second internal electrodes 422 may be formed to be spaced apart from one another at a predetermined distance.

According to the present exemplary embodiment, the first and second external electrodes 431 and 432 may be formed on both lateral surfaces of the ceramic body 410.

The first external electrode 431 may be formed on the first and second main surfaces and the first lateral surface of the ceramic body 410, and the second external electrode 132 may be formed on the first and second main surfaces and the second lateral surface of the ceramic body 410.

The first external electrode 431 may include the first base electrode 431a electrically connected to the first internal electrode 421 and the first terminal electrode 431b formed on the first base electrode 431a.

The second external electrode 432 may include the second base electrode 432a electrically connected to the second internal electrode 422 and the second terminal electrode 432b formed on the second base electrode 432a.

Meanwhile, the multilayer ceramic electronic component to be embedded in a board according to the present exemplary embodiment may include the non-conductive paste layer 433 formed on both end surfaces of the ceramic body 410 in which the first and second base electrodes 431a and 432a are formed.

Hereinafter, the structures of the first and second external electrodes 431 and 432 and the non-conductive paste layer 433 will be described in detail.

FIG. 17 is a cross-sectional view illustrating the first end surface of the multilayer ceramic electronic component to be embedded in a board according to the present exemplary embodiment.

Referring to FIG. 17, the first and second base electrodes 431a and 432a may be formed to be spaced apart at a predetermined distance from the region in which the first and second leads 421a, 421b, 422a, and 422b overlap.

Namely, the first and second base electrodes 431a and 432a may not cover portions of the first and second leads 421a, 421b, 422a, and 422b in a direction of a central portion of the ceramic body 410.

Also, the non-conductive paste layer 433 may be formed on both lateral surfaces of the ceramic body 410 in which the first and second base electrodes 431a and 432a are formed.

Other features of the multilayer ceramic electronic component are identical to those of the multilayer ceramic electronic component according to the former exemplary embodiment of the present disclosure as described above, so descriptions thereof will be omitted.

Hereinafter, a method for manufacturing a multilayer ceramic electronic component to be embedded in a board according to an exemplary embodiment of the present disclosure will be described, but the present inventive concept is not limited thereto.

In the method for manufacturing a multilayer ceramic electronic component to be embedded in a board according to the present exemplary embodiment, first, a slurry including powder such as barium titanate ($BaTiO_3$) powder, or the like, may be coated on a carrier film and dried to prepare a plurality of ceramic green sheets, thus forming dielectric layers.

The ceramic green sheet may be manufactured as a sheet having a thickness of a few micrometers (μm) by mixing a ceramic powder, a binder, and a solvent to prepare a slurry and treating the slurry with a doctor blade method.

Next, a conductive paste for an internal electrode including 40 to 50 parts by weight of nickel powder having an average grain size ranging from 0.1 μm to 0.2 μm may be prepared.

The conductive paste for an internal electrode may be coated on the green sheet according to a screen printing method to form an internal electrode, and 400 to 500 layers of the internal electrodes may be stacked to manufacture a ceramic body 10.

Thereafter, a first base electrode and a second base electrode including a conductive metal and glass may be formed on end portions of the ceramic body.

The conductive metal may be one or more selected from the group consisting of, for example, copper (Cu), silver (Ag), nickel (Ni), and an alloy thereof, but the conductive metal is not particularly limited.

The glass is not particularly limited, but a material having a composition identical to that of the glass used for manufacturing external electrodes of a general multilayer ceramic capacitor may be used.

The first and second base electrodes may electrically connected to the first and second internal electrodes by being formed on the end portions of the ceramic body.

Thereafter, first and second terminal electrodes made of copper (Cu) may be formed on the first and second base electrodes.

Descriptions of parts having characteristics identical to those of the multilayer ceramic electronic component according to the former exemplary embodiment of the present disclosure as described above will be omitted.

Figure 19:
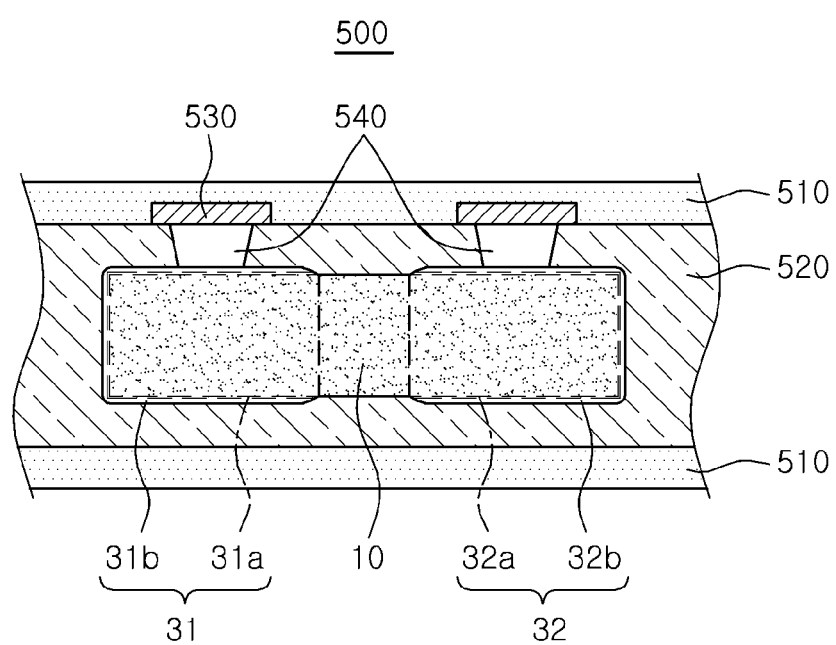
FIG. 19 is a cross-sectional view illustrating a printed circuit board (PCB) having a multilayer ceramic electronic component embedded therein according to an exemplary embodiment of the present disclosure.

FIG. 19 is a cross-sectional view illustrating a printed circuit board (PCB) having a multilayer ceramic electronic component embedded therein according to an exemplary embodiment of the present disclosure.

Referring to FIG. 19, a PCB 500 having a multilayer ceramic electronic component embedded therein according to the present exemplary embodiment may include an insulating board 510; and an embedded multilayer ceramic electronic component according to the exemplary embodiment of the present disclosure as described above embedded in the insulating board 510.

The insulating board 510 may have a structure including an insulating layer 520, and may include a conductive pattern 530 and a conductive via hole 540 constituting various types of interlayer circuits as necessary, as illustrated in FIG. 19. The insulating board 510 may be the PCB 500 having a multilayer ceramic electronic component embedded therein.

After being inserted into the PCB 500, the multilayer ceramic electronic component may undergo various severe conditions during a post-process such as a heat treatment, or the like, performed on the PCB 500.

In particular, contraction and expansion of the PCB 500 during the heat treatment process may be directly transferred to the multilayer ceramic electronic component inserted in the PCB 500, applying stress to a bonding surface of the multilayer ceramic electronic component and the PCB 500.

When the stress applied to the bonding surface of the multilayer ceramic electronic component and the PCB 500 is greater than adhesive bonding strength, the bonding surface may be separated to cause a delamination defect.

The adhesive bonding strength between the multilayer ceramic electronic component and the PCB 500 is proportional to electrochemical bonding force of the multilayer ceramic electronic component and the PCB 500 and an effective surface area of the bonding surface. In order to enhance the effective surface area of the bonding surface between the multilayer ceramic electronic component and the PCB 500, surface roughness of the multilayer ceramic electronic component may be controlled to improve delamination between the multilayer ceramic electronic component and the PCB 500.

Also, frequency of delamination of the bonding surface with the PCB 500 due to the surface roughness of the multilayer ceramic electronic component embedded in the PCB 500 may be checked.

As set forth above, according to exemplary embodiments of the present disclosure, by forming a conductive paste layer or a non-conductive paste layer on external electrodes of a multilayer ceramic electronic component to be embedded in a board, degradation of reliability due to infiltration of plating solution may be prevented.

Also, by exposing internal electrodes to lateral surfaces of a ceramic body in the multilayer ceramic electronic component to be embedded in a board, a current path may be reduced to reduce ESL.

In addition, since the thickness of base electrodes is reduced due to the non-conductive paste layer or the conductive paste layer, the electronic component may be miniaturized.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic electronic component to be embedded in a board, the multilayer ceramic electronic component comprising:

a ceramic body including dielectric layers and having first and second main surfaces opposing one another, first and second lateral surfaces opposing one another, and first and second end surfaces opposing one another;

first internal electrodes and second internal electrodes stacked to be spaced apart from both end surfaces of the ceramic body at a predetermined distance with the dielectric layers interposed therebetween and having first and second leads exposed to the first and second lateral surfaces of the ceramic body, respectively; and first and second external electrodes formed in both end portions of the ceramic body, wherein the first and second external electrodes comprise first and second base electrodes electrically connected to the first and second internal electrodes, respectively, and first and second terminal electrodes formed on the first and second base electrodes, respectively, and a non-conductive paste layer is formed on both lateral surfaces of the ceramic body in which the first and second base electrodes are formed.

2. The multilayer ceramic electronic component of claim 1, wherein the non-conductive paste layer includes an epoxy resin.

3. The multilayer ceramic electronic component of claim 1, wherein the first external electrode is formed on the first and second main surfaces and the first end surface of the ceramic body, and the second external electrode is formed on the first and second main surfaces and the second end surface of the ceramic body.

4. The multilayer ceramic electronic component of claim 1, wherein the first and second terminal electrodes are formed of copper (Cu).

5. A multilayer ceramic electronic component to be embedded in a board, the multilayer ceramic electronic component comprising:
   a ceramic body including dielectric layers and having first and second main surfaces opposing one another, first and second lateral surfaces opposing one another, and first and second end surfaces opposing one another;
   first internal electrodes and second internal electrodes stacked to be spaced apart from both end surfaces of the ceramic body at a predetermined distance with the dielectric layers interposed therebetween and having first and second leads exposed to the first and second lateral surfaces of the ceramic body, respectively; and
   first and second external electrodes formed in both end portions of the ceramic body,
   wherein the first and second external electrodes comprise first and second base electrodes electrically connected to the first and second internal electrodes, first and second conductive paste layers formed on the first and second base electrodes to cover the first and second leads in both lateral surfaces of the ceramic body, and first and second terminal electrodes formed on the first and second base electrodes and the first and second conductive paste layers.

6. The multilayer ceramic electronic component of claim 5, wherein the first external electrode is formed on the first and second main surfaces and the first end surface of the ceramic body, and the second external electrode is formed on the first and second main surfaces and the second end surface of the ceramic body.

7. The multilayer ceramic electronic component of claim 5, wherein the first and second terminal electrodes are formed of copper (Cu).

8. A multilayer ceramic electronic component to be embedded in a board, the multilayer ceramic electronic component comprising:
   a ceramic body including dielectric layers and having first and second main surfaces opposing one another, first and second lateral surfaces opposing one another, and first and second end surfaces opposing one another;
   first internal electrodes and second internal electrodes stacked to be spaced apart from both end surfaces of the ceramic body at a predetermined distance with the dielectric layers interposed therebetween and having first and second leads exposed to the first and second lateral surfaces of the ceramic body, respectively; and
   first and second external electrodes formed in both end portions of the ceramic body,
   wherein portions of the first and second leads of the first internal electrodes and the first and second leads of the second internal electrodes overlap, the first and second external electrodes comprise first and second base electrodes electrically connected to the first and second internal electrodes, respectively, and first and second terminal electrodes formed on the first and second base electrodes, respectively, a non-conductive paste layer is formed on both lateral surfaces of the ceramic body in which the first and second base electrodes are formed, and the first and second base electrodes are formed to be spaced apart at a predetermined distance from the region in which the first and second leads overlap.

9. The multilayer ceramic electronic component of claim 8, wherein the non-conductive paste layer includes an epoxy resin.

10. The multilayer ceramic electronic component of claim 8, wherein the first external electrode is formed on the first and second main surfaces and the first end surface of the ceramic body, and the second external electrode is formed on the first and second main surfaces and the second end surface of the ceramic body.

11. The multilayer ceramic electronic component of claim 8, wherein the first and second terminal electrodes are formed of copper (Cu).

12. A multilayer ceramic electronic component to be embedded in a board, the multilayer ceramic electronic component comprising:
   a ceramic body including dielectric layers and having first and second main surfaces opposing one another, first and second lateral surfaces opposing one another, and first and second end surfaces opposing one another;
   first internal electrodes and second internal electrodes stacked to be spaced apart from both end surfaces of the ceramic body at a predetermined distance with the dielectric layers interposed therebetween and having first and second leads exposed to the first and second lateral surfaces of the ceramic body, respectively; and
   first and second external electrodes formed in both end portions of the ceramic body,
   wherein the first and second leads of the first internal electrodes and the first and second leads of the second internal electrodes are formed to be spaced apart from one another at a predetermined distance, the first and second external electrodes comprise first and second base electrodes electrically connected to the first and second internal electrodes, respectively, and first and second terminal electrodes formed on the first and second base electrodes, respectively, a non-conductive paste layer is formed on both lateral surfaces of the ceramic body in which the first and second base electrodes are formed, and the first and second base electrodes are formed in portions of the first and second leads.

13. The multilayer ceramic electronic component of claim 12, wherein the non-conductive paste layer includes an epoxy resin.

14. The multilayer ceramic electronic component of claim 12, wherein the first external electrode is formed on the first and second main surfaces and the first end surface of the ceramic body, and the second external electrode is formed on the first and second main surfaces and the second end surface of the ceramic body.

15. The multilayer ceramic electronic component of claim 12, wherein the first and second terminal electrodes are formed of copper (Cu).

16. A multilayer ceramic electronic component to be embedded in a board, the multilayer ceramic electronic component comprising:
   a ceramic body including dielectric layers and having first and second main surfaces opposing one another, first and second lateral surfaces opposing one another, and first and second end surfaces opposing one another;

first internal electrodes and second internal electrodes formed to be alternately exposed to both lateral surfaces of the ceramic body with the dielectric layers interposed therebetween and having first and second leads exposed to the first and second end surfaces of the ceramic body, respectively; and a first external electrode formed on the first lateral surface of the ceramic body and a second external electrode formed on the second lateral surface of the ceramic body, wherein portions of the first and second leads of the first internal electrodes and portions of the first and second leads of the second internal electrodes overlap, the first and second external electrodes comprise first and second base electrodes electrically connected to the first and second internal electrodes, respectively, and first and second terminal electrodes formed on the first and second base electrodes, respectively, a non-conductive paste layer is formed on both end surfaces of the ceramic body in which the first and second base electrodes are formed, and the first and second base electrodes are formed to be spaced apart at a predetermined distance from the region in which the first and second leads overlap.

17. The multilayer ceramic electronic component of claim 16, wherein the non-conductive paste layer includes an epoxy resin.

18. The multilayer ceramic electronic component of claim 16, wherein the first external electrode is formed on the first and second main surfaces and the first lateral surface of the ceramic body, and the second external electrode is formed on the first and second main surfaces and the second lateral surface of the ceramic body.

19. The multilayer ceramic electronic component of claim 16, wherein the first and second terminal electrodes are formed of copper (Cu).

20. A multilayer ceramic electronic component to be embedded in a board, the multilayer ceramic electronic component comprising:

a ceramic body including dielectric layers and having first and second main surfaces opposing one another, first and second lateral surfaces opposing one another, and first and second end surfaces opposing one another;

first internal electrodes and second internal electrodes formed to be alternately exposed to both lateral surfaces of the ceramic body with the dielectric layers interposed therebetween and having first and second leads exposed to the first and second end surfaces of the ceramic body, respectively; and a first external electrode formed on the first lateral surface of the ceramic body and a second external electrode formed on the second lateral surface of the ceramic body, wherein the first and second leads of the first internal electrodes and the first and second leads of the second internal electrodes are formed to be spaced apart from one another at a predetermined distance, the first and second external electrodes comprise first and second base electrodes electrically connected to the first and second internal electrodes, respectively, and first and second terminal electrodes formed on the first and second base electrodes, respectively, a non-conductive paste layer is formed on both end surfaces of the ceramic body in which the first and second base electrodes are formed, and the first and second base electrodes are formed in portions of the first and second leads.

21. The multilayer ceramic electronic component of claim 20, wherein the non-conductive paste layer includes an epoxy resin.

22. The multilayer ceramic electronic component of claim 20, wherein the first external electrode is formed on the first and second main surfaces and the first lateral surface of the ceramic body, and the second external electrode is formed on the first and second main surfaces and the second lateral surface of the ceramic body.

23. The multilayer ceramic electronic component of claim 20, wherein the first and second terminal electrodes are formed of copper (Cu).

24. A printed circuit board (PCB) having a multilayer ceramic electronic component embedded therein, the PCB comprising:

an insulating board; and a multilayer ceramic electronic component formed in the insulating board and corresponding to claim 1.

25. A printed circuit board (PCB) having a multilayer ceramic electronic component embedded therein, the PCB comprising:

an insulating board; and a multilayer ceramic electronic component formed in the insulating board and corresponding to claim 5.

26. A printed circuit board (PCB) having a multilayer ceramic electronic component embedded therein, the PCB comprising:

an insulating board; and a multilayer ceramic electronic component formed in the insulating board and corresponding to claim 8.

27. A printed circuit board (PCB) having a multilayer ceramic electronic component embedded therein, the PCB comprising:

an insulating board; and a multilayer ceramic electronic component formed in the insulating board and corresponding to claim 12.

28. A printed circuit board (PCB) having a multilayer ceramic electronic component embedded therein, the PCB comprising:

an insulating board; and a multilayer ceramic electronic component formed in the insulating board and corresponding to claim 16.

29. A printed circuit board (PCB) having a multilayer ceramic electronic component embedded therein, the PCB comprising:

an insulating board; and a multilayer ceramic electronic component formed in the insulating board and corresponding to claim 20.

* * * * *